(12) United States Patent
Shuto et al.

(10) Patent No.: US 8,953,359 B2
(45) Date of Patent: Feb. 10, 2015

(54) SEMICONDUCTOR MEMORY DEVICE (71) Applicant: Kabushiki Kaisha Toshiba, Tokyo (JP)

(72) Inventors: Susumu Shuto, Kanagawa (JP);
Takayuki Okada, Mie (JP); Iwao Kunishima, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/952,382

(22) Filed: Jul. 26, 2013

(65) Prior Publication Data

US 2014/0254274 A1 Sep. 11, 2014

(30) Foreign Application Priority Data

Mar. 6, 2013 (JP) ................. 2013-044106

(51) Int. Cl.
*G11C 11/22* (2006.01)
*G11C 16/04* (2006.01)
*G11C 11/412* (2006.01)

(52) U.S. Cl.
CPC .................. *G11C 11/412* (2013.01)
USPC .................. 365/145; 365/185.01; 365/185.17

(58) Field of Classification Search
USPC ........................................ 365/145
See application file for complete search history.

(56) References Cited

U.S. PATENT DOCUMENTS

| 5,303,182 | A | * | 4/1994 | Nakao et al. | 365/145 |
| 5,666,305 | A | * | 9/1997 | Mihara et al. | 365/145 |
| 6,888,736 | B2 | * | 5/2005 | Dimmler et al. | 365/145 |
| 7,902,594 | B2 | | 3/2011 | Ono | |
| 8,139,388 | B2 | * | 3/2012 | Takahashi et al. | 365/145 |
| 8,164,941 | B2 | * | 4/2012 | Kang et al. | 365/145 |
| 8,179,710 | B2 | * | 5/2012 | Minami | 365/145 |
| 2006/0139987 | A1 | * | 6/2006 | Kang et al. | 365/145 |
| 2011/0176351 | A1 | | 7/2011 | Fujitsuka et al. | |

FOREIGN PATENT DOCUMENTS

| JP | 05-291583 A | 11/1993 |
| JP | 06-224384 A | 8/1994 |
| JP | 08-124378 A | 5/1996 |
| JP | 2009-170511 A | 7/2009 |
| JP | 2010-079941 A | 4/2010 |

\* cited by examiner

*Primary Examiner* — Son Mai
(74) *Attorney, Agent, or Firm* — Holtz, Holtz, Goodman & Chick PC (57) ABSTRACT

According to one embodiment, a semiconductor memory device includes a memory cell and a control circuit. The memory cell is such that a ferroelectric film is provided as a gate dielectric film. When data is stored in the memory cell, the control circuit applies a first voltage to the gate dielectric film and thereafter applies a second voltage, whose amplitude is smaller than that of the first voltage and whose polarity is opposite to that of the first voltage.

18 Claims, 10 Drawing Sheets

SEMICONDUCTOR MEMORY DEVICE

CROSS-REFERENCE TO RELATED APPLICATIONS

This application is based upon and claims the benefit of priority from Japanese Patent Application No. 2013-44106, filed on Mar. 6, 2013; the entire contents of which are incorporated herein by reference.

FIELD

Embodiments described herein relate generally to a semiconductor memory device.

BACKGROUND

In some semiconductor memory devices, a ferroelectric field-effect transistor (FeFET) is used as a memory cell to cope with scaling of memory cells. Ferroelectric field-effect transistors can store data by inverting the polarization direction of a ferroelectric film.

DETAILED DESCRIPTION

According to one embodiment, a semiconductor memory device includes a memory cell and a control circuit. The memory cell is such that a ferroelectric film is provided as a gate dielectric film. When data is stored in the memory cell, the control circuit applies a first voltage to the gate dielectric film and thereafter applies a second voltage, whose amplitude is smaller than that of the first voltage and whose polarity is opposite to that of the first voltage.

A semiconductor memory device according to embodiments will be explained below in detail with reference to the accompanying drawings. The present invention is not limited to the following embodiments.

(First Embodiment)

Figure 1:
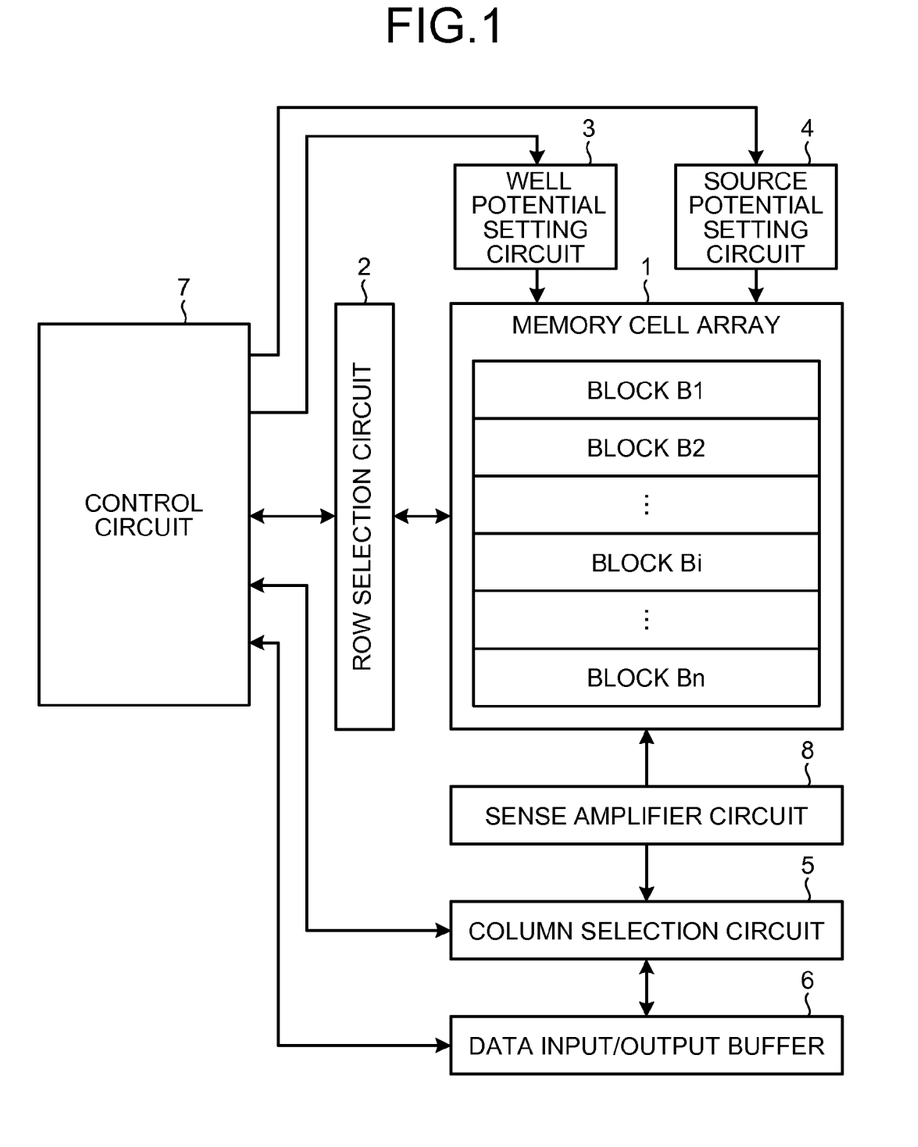
FIG. 1 is a block diagram illustrating the schematic configuration of a semiconductor memory device according to a first embodiment.

FIG. 1 is a block diagram illustrating the schematic configuration of a semiconductor memory device according to the first embodiment.

In FIG. 1, this semiconductor memory device includes a memory cell array 1, a row selection circuit 2, a well potential setting circuit 3, a source potential setting circuit 4, a column selection circuit 5, a data input/output buffer 6, a control circuit 7, and a sense amplifier circuit 8.

In the memory cell array 1, memory cells, which store data, are arranged in a matrix in a row direction and a column direction. A cell transistor in which a ferroelectric film is provided as a gate dielectric film can be used as a memory cell. One memory cell may store 1 bit of data or may perform multi-level recording to be able to store 2 or more bits of data.

The memory cell array 1 is divided into n (n is a positive integer) number of blocks B1 to Bn. Each of the blocks B1 to Bn can be configured by arraying a plurality of NAND cells in the row direction.

At the time of read, write, and erase operations of a memory cell, the row selection circuit 2 can select memory cells in the row direction in the memory cell array 1. At the time of read, write, and erase operations of a memory cell, the well potential setting circuit 3 can set a well potential of the memory cell array 1. At the time of read, write, and erase operations of a memory cell, the source potential setting circuit 4 can set a source potential of the memory cell array 1. At the time of read, write, and erase operations of a memory cell, the column selection circuit 5 can select memory cells in the column direction of the memory cell array 1. The sense amplifier circuit 8 can determine data read from memory cells for each column. The data input/output buffer 6 can send a command or an address received from the outside to the control circuit 7 and can perform reception and transmission of data between the sense amplifier circuit 8 and the outside.

The control circuit 7 can control operations of the row selection circuit 2, the well potential setting circuit 3, the source potential setting circuit 4, and the column selection circuit 5 on the basis of a command and an address. When data is stored in a memory cell, the control circuit 7 can apply a first voltage to the gate dielectric film thereof and thereafter apply a second voltage, whose amplitude is smaller than that of the first voltage and whose polarity is opposite to that of the first voltage. The amplitude of the first voltage is set such that it is equal to or higher than the polarization inversion threshold of a ferroelectric film used as a gate dielectric film in a memory cell. The amplitude of the second voltage is set such that it is lower than the polarization inversion threshold of a ferroelectric film used as a gate dielectric film in a memory cell.

Figure 2:
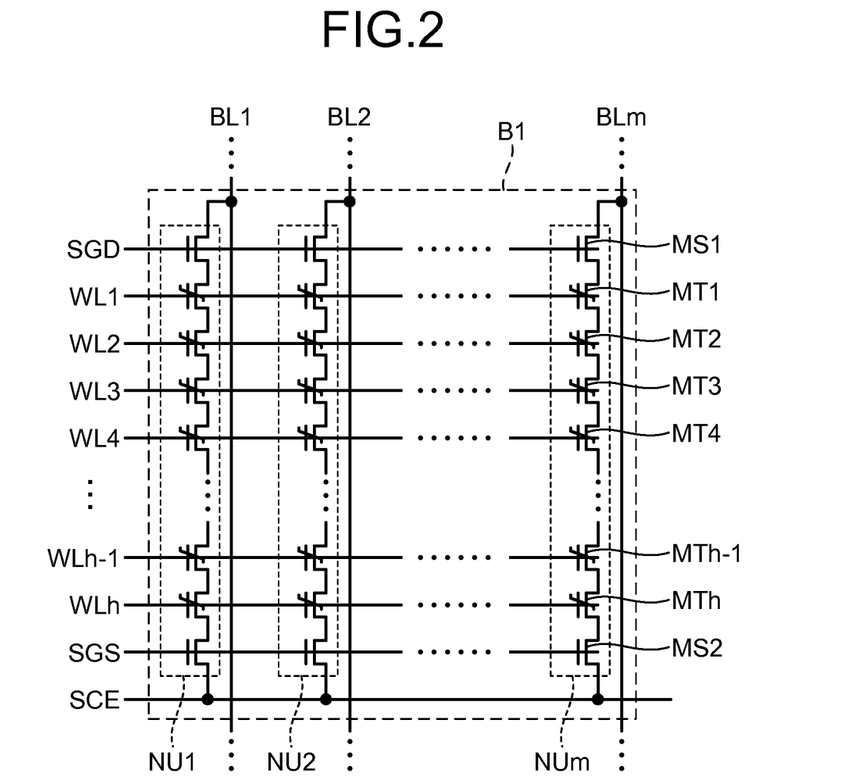
FIG. 2 is a circuit diagram illustrating the schematic configuration of a block of the semiconductor memory device in FIG. 1.

FIG. 2 is a circuit diagram illustrating the schematic configuration of a block of the semiconductor memory device in FIG. 1.

In FIG. 2, in each of the blocks B1 to Bn, h (h is a positive integer) number of word lines WL1 to WLh, select gate lines SGD and SGS, and a source line SCE are provided. Moreover, in the blocks B1 to Bn, m (m is a positive integer) number of bit lines BL1 to BLm are provided in common.

In each of the blocks B1 to Bn, m number of NAND cells NU1 to NUm are provided and the NAND cells NU1 to NUm are connected to the bit lines BL1 to BLm, respectively.

In each of the NAND cells NU1 to NUm, cell transistors MT1 to MTh and select transistors MS1 and MS2 are provided. One memory cell in the memory cell array 1 can be composed of one cell transistor. A NAND string is configured by connecting the cell transistors MT1 to MTh in series and the select transistors MS1 and MS2 are connected to both ends of the NAND string, thereby forming each of the NAND cells NU1 to NUm.

In each of the NAND cells NU1 to NUm, the word lines WL1 to WLh are connected to the control gate electrodes of the cell transistors MT1 to MTh, respectively. A plurality of memory cells in the row direction that share each of the word lines WL1 to WLh form a page. Moreover, in each of the NAND cells NU1 to NUm, one end of the NAND string composed of the cell transistors MT1 to MTh is connected to a corresponding one of the bit lines BL1 to BLm via the select transistor MS1 and the other end of the NAND string is connected to the source line SCE via the select transistor MS2. The gate electrodes of the select transistors MS1 are connected to the select gate line SGD and the gate electrodes of the select transistors MS2 are connected to the select gate line SGS.

Figure 3A:
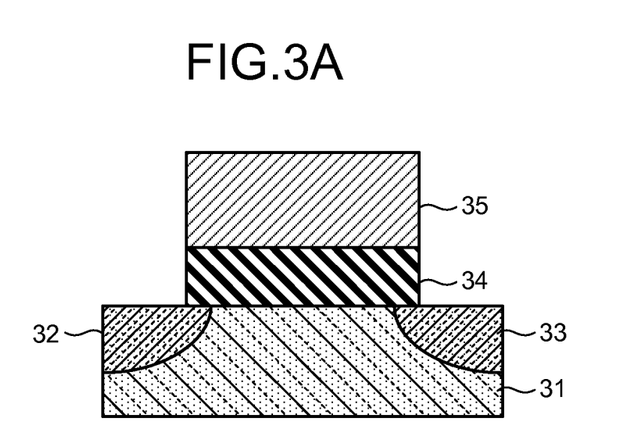
FIG. 3A is a cross-sectional view illustrating one example of the cell transistor of the semiconductor memory device in FIG. 1.
Figure 3B:
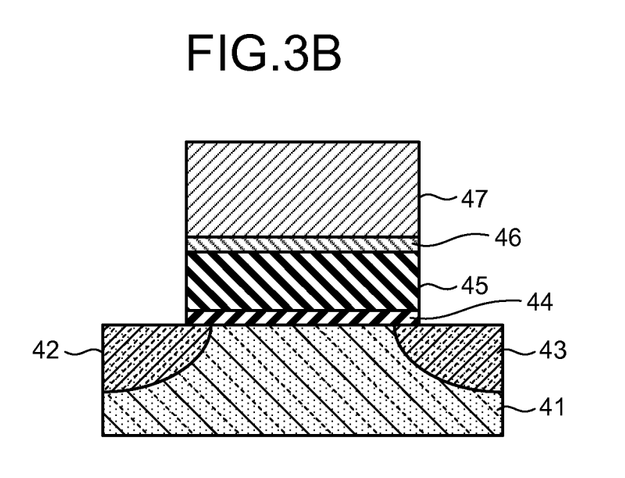
FIG. 3B is a cross-sectional view illustrating another example of the cell transistor of the semiconductor memory device in FIG. 1.

FIG. 3A is a cross-sectional view illustrating one example of the cell transistor of the semiconductor memory device in FIG. 1 and FIG. 3B is a cross-sectional view illustrating another example of the cell transistor of the semiconductor memory device in FIG. 1.

In FIG. 3A, a control gate electrode 35 is provided on a well 31 with a ferroelectric film 34 therebetween. The well 31 is provided with a source layer 33 and a drain layer 32 arranged on both sides of the control gate electrode 35. For the well 31, it is possible to use semiconductors, such as Si, Ge, SiGe, SiC, SiSn, PbS, GaAs, InP, GaP, GaN, and ZnSe. For the ferroelectric film 34, for example, $HfO_2$ can be used and 2 to 3 mol % of Si may be added to the $HfO_2$. For the control gate electrode 35, for example, polycrystalline silicon can be used.

In FIG. 3B, a control gate electrode 47 is provided on a well 41 with an interface dielectric film 44, a ferroelectric film 45, and a barrier metal film 46, which are arranged sequentially in the order that they appear in this sentence, therebetween. Moreover, the well 41 is provided with a source layer 43 and a drain layer 42 arranged on both sides of the control gate electrode 47. For the well 41, it is possible to use semiconductors, such as Si, Ge, SiGe, SiC, SiSn, PbS, GaAs, InP, GaP, GaN, and ZnSe. For the interface dielectric film 44, for example, $SiO_2$ can be used. For the ferroelectric film 45, for example, $HfO_2$ can be used and 2 to 3 mol % of Si may be added to the $HfO_2$. For the barrier metal film 46, for example, TiN can be used. For the control gate electrode 47, for example, polycrystalline silicon can be used.

In the following description, the cell transistor in FIG. 3A will be explained as an example. Transition of the threshold of the cell transistor from a low value to a high value is referred to as a write operation and transition of the threshold of the cell transistor from a high value to a low value is referred to as an erase operation.

Figure 4A:
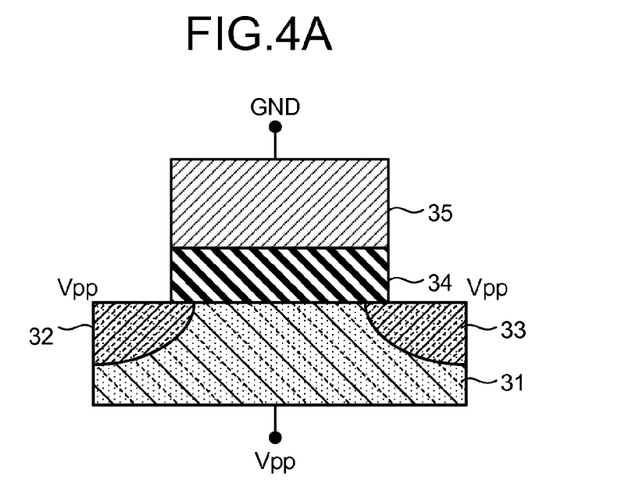
FIG. 4A is a cross-sectional view illustrating a write voltage applying method in the semiconductor memory device in FIG. 1.
Figure 4B:
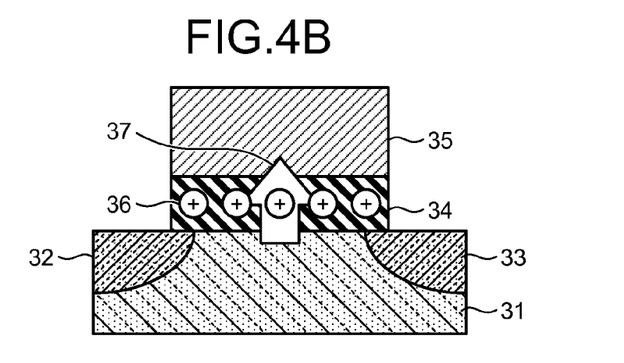
FIG. 4B is a cross-sectional view illustrating a state of a cell transistor after a write voltage is applied in FIG. 4A.
Figure 4C:
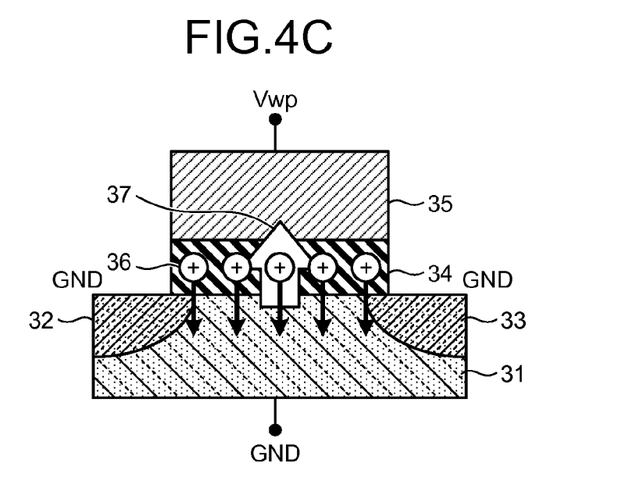
FIG. 4C is a cross-sectional view illustrating a weak-erase-voltage applying method in the semiconductor memory device in FIG. 1.

FIG. 4A is a cross-sectional view illustrating a write voltage applying method in the semiconductor memory device in FIG. 1, FIG. 4B is a cross-sectional view illustrating a state of a cell transistor after a write voltage is applied in FIG. 4A, and FIG. 4C is a cross-sectional view illustrating a weak-erase-voltage applying method in the semiconductor memory device in FIG. 1.

In the write operation, after the first voltage is collectively applied to the gate dielectric films in the memory cells per block B1 to Bn at the time of writing, the second voltage can be collectively applied to the gate dielectric films in the memory cells per block B1 to Bn at the time of weak erasing.

Specifically, in FIG. 4A, at the time of writing, 0 V is applied to the word lines WL1 to WLh of the blocks B1 to Bn and the well potential of the memory cell array 1 is set to the write voltage Vpp (for example, 6 V). The source layer 33 and the drain layer 32 can be set to the write voltage Vpp. At this time, a high voltage is applied to the ferroelectric film 34 such that the channel side becomes positive and the control gate electrode 35 side becomes negative. Therefore, as illustrated in FIG. 4B, polarization 37 occurs in the ferroelectric film 34 such that the channel side becomes negative and the control gate electrode 35 side becomes positive, and the threshold of the cell transistor increases. At this time, positive trapped charge 36 is trapped in the ferroelectric film 34 so as to cancel the increase in the threshold of the cell transistor.

Next, as illustrated in FIG. 4C, at the time of weak erasing, the weak erase voltage Vwp (for example, 0.5 V) is applied to the word lines WL1 to WLh of the blocks B1 to Bn and the well potential of the memory cell array 1 is set to 0V. The source layer 33 and the drain layer 32 can be set to 0 V. At this time, an electric field is applied to the ferroelectric film 34 in the direction opposite to that applied at the time of writing. Therefore, the trapped charge 36 trapped in the ferroelectric film 34 is extracted and the effect of suppressing the increase in the threshold of the cell transistor due to the trapped charge 36 is eliminated.

The absolute value of the weak erase voltage Vwp can be set to a value smaller than the polarization inversion threshold of the ferroelectric film 34. For example, when the polarization inversion threshold of the ferroelectric film 34 is 2.5 V, the absolute value of the weak erase voltage Vwp can be set to a value smaller than 2.5 V. Consequently, the trapped charge 36 trapped in the ferroelectric film 34 can be extracted without destroying the written state of the memory cell.

As described above, the difference between the erased state and the written state with regard to the threshold of a cell transistor can be expanded by performing weak erasing after writing; therefore, a read margin can be increased and stability of the threshold after polarization inversion of a cell transistor can be improved.

In the method in FIG. 4A, an explanation is given of a method of applying the write voltage Vpp to the well 31, the source layer 33, and the drain layer 32 of a memory cell and applying 0 V to the control gate electrode 35 at the time of writing; however, 0 V may be applied to the well 31, the source layer 33, and the drain layer 32 of a memory cell and −Vpp may be applied to the control gate electrode 35.

Figure 5:
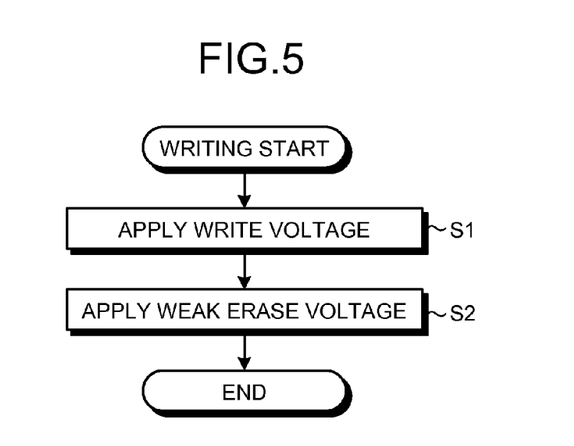
FIG. 5 is a flowchart illustrating an operation performed by the semiconductor memory device in FIG. 1 at the time of writing.

FIG. 5 is a flowchart illustrating an operation performed by the semiconductor memory device in FIG. 1 at the time of writing.

In FIG. 5, when the write operation is started, the write voltage Vpp is applied to a memory cell such that polarization inversion occurs in the ferroelectric film 34 (S1).

Next, the weak erase voltage Vwp is applied to the memory cell such that an electric field is applied to the ferroelectric film 34 in the direction opposite to that applied at the time of writing and data written in the memory cell is not erased (S2).

Figure 6:
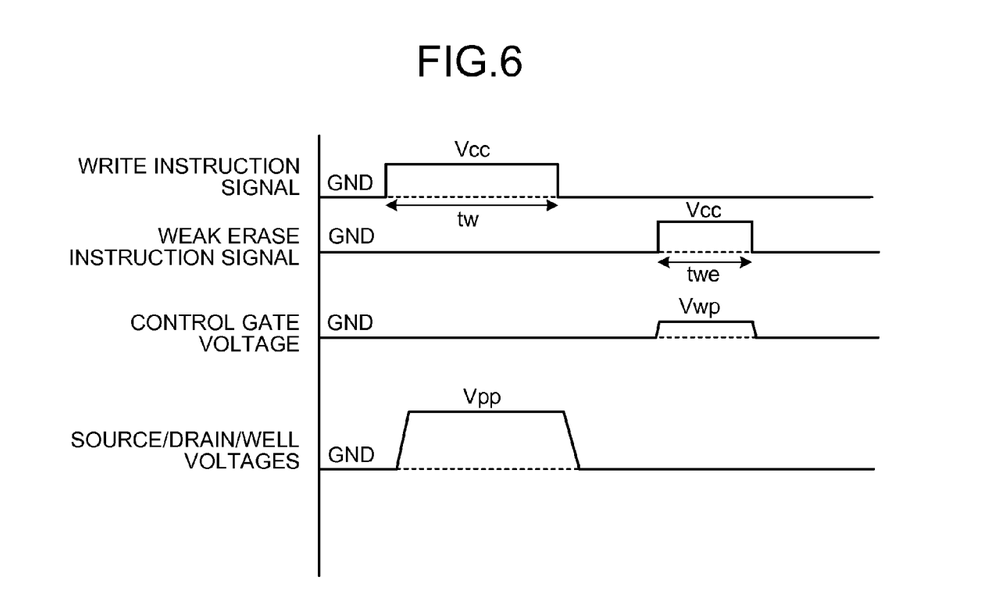
FIG. 6 is a timing chart illustrating an operation performed by the semiconductor memory device in FIG. 1 at the time of writing.

FIG. 6 is a timing chart illustrating an operation performed by the semiconductor memory device in FIG. 1 at the time of writing.

In FIG. 6, before writing, the control gate voltage and the source/drain/well voltages are set to the ground potential GND. Then, when the write instruction signal rises from the ground potential GND to the power supply potential Vcc, the source/drain/well voltages rise from the ground potential GND to the write voltage Vpp. Therefore, the polarization 37 occurs in the ferroelectric film 34 such that the channel side becomes negative and the control gate electrode 35 side becomes positive. Thus, the threshold of the cell transistor increases.

Next, when the write instruction signal falls from the power supply potential Vcc to the ground potential GND, the source/drain/well voltages fall from the write voltage Vpp to the ground potential GND. Then, when the weak erase instruction signal rises from the ground potential GND to the power supply potential Vcc, the control gate voltage rises from the ground potential GND to the weak erase voltage Vwp. Therefore, the trapped charge 36 trapped in the ferroelectric film 34 is extracted and thus the effect of suppressing the increase in the threshold of the cell transistor due to the trapped charge 36 is eliminated. Then, when the weak erase instruction signal falls from the power supply potential Vcc to the ground potential GND, the control gate voltage falls from the weak erase voltage Vwp to the ground potential GND.

At this time, the write voltage Vpp and the weak erase voltage Vwp can be set such that the absolute value of the electric field applied to the ferroelectric film 34 when the trapped charge in the ferroelectric film 34 is extracted is smaller than the absolute value of the electric field applied to the ferroelectric film 34 when the polarization in the ferroelectric film 34 is inverted. The time twe (for example, 50 ns) during which the electric field due to the weak erase voltage Vwp is applied to the ferroelectric film 34 can be set shorter than the time tw (for example, 100 ns) during which the electric field due to the write voltage Vpp is applied to the ferroelectric film 34. Moreover, the height or width of the voltage pulse of the weak erase voltage Vwp may be variable. Moreover, the height or width of the voltage pulse of the weak erase voltage Vwp can be specified from the outside.

In the above description, an explanation is given of a method in which, in the write operation, after the first voltage is collectively applied to gate dielectric films in memory cells per block B1 to Bn at the time of writing, the second voltage is collectively applied to the gate dielectric films in the memory cells per block B1 to Bn at the time of weak erasing. As another method, it may be such that after the first voltage is collectively applied to gate dielectric films in memory cells per block B1 to Bn at the time of writing, the second voltage is applied to a gate dielectric film in a memory cell per bit at the time of weak erasing. In this weak erasing, the voltage applied to the control gate electrode 35 of a selected cell in a NAND string can be set larger than the voltage applied to the control gate electrodes 35 of nonselected cells in the NAND string. For example, the weak erase voltage Vwp (for example, 1 V) is applied to the selected word line and 0 V is applied to the selected bit line. A voltage (for example, 0.8 V) sufficient to turn on the nonselected cells in the NAND string that includes the selected cell is applied to the nonselected word lines and an erase inhibit voltage Vfe (for example, 0.5 V) is applied to the nonselected bit lines. Moreover, a voltage that turns the select transistors MS1 on is applied to the select gate line SGD and a voltage that turns the select transistors MS2 off is applied to the select gate line SGS.

As still another method, it may be such that after the first voltage is collectively applied to gate dielectric films in memory cells per block B1 to Bn at the time of writing, the second voltage is applied to gate dielectric films in memory cells per NAND string at the time of weak erasing. In this weak erasing, the voltage applied to the ferroelectric films 34 in memory cells in a selected NAND string can be set larger than the voltage applied to the ferroelectric films 34 in memory cells in nonselected NAND strings. For example, the weak erase voltage Vwp (for example, 0.8 V) is applied to the selected word lines WL1 to WLh, and moreover, whereas 0 V is applied to the bit line to which the selected NAND string is connected, the erase inhibit voltage Vfe (for example, 0.5 V) is applied to the bit lines to which the nonselected NAND strings are connected. Moreover, a voltage that turns the select transistors MS1 on is applied to the select gate line SGD and a voltage that turns the select transistors MS2 off is applied to the select gate line SGS.

(Second Embodiment)

Figure 7A:
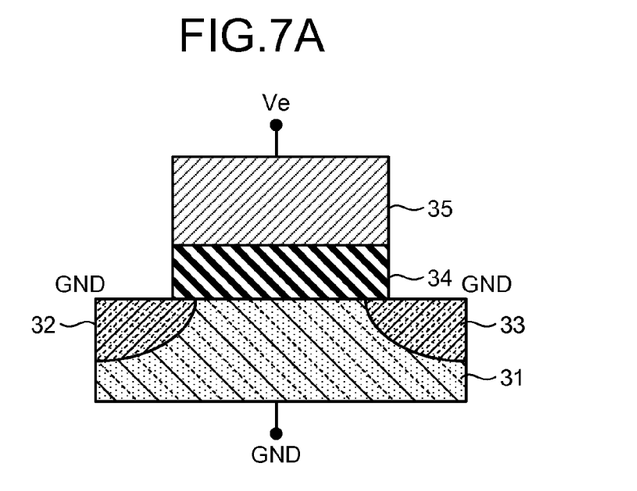
FIG. 7A is a cross-sectional view illustrating an erase voltage applying method of a semiconductor memory device according to the second embodiment.
Figure 7B:
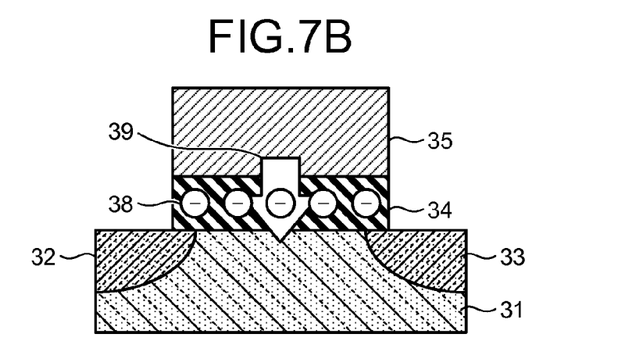
FIG. 7B is a cross-sectional view illustrating a state of a cell transistor after an erase voltage is applied in FIG. 7A.
Figure 7C:
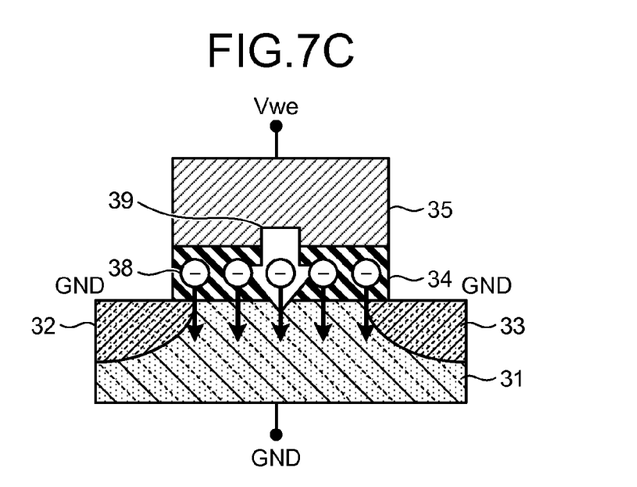
FIG. 7C is a cross-sectional view illustrating a weak-write-voltage applying method of the semiconductor memory device according to the second embodiment.

FIG. 7A is a cross-sectional view illustrating an erase voltage applying method of a semiconductor memory device according to the second embodiment, FIG. 7B is a cross-sectional view illustrating a state of a cell transistor after an erase voltage is applied in FIG. 7A, and FIG. 7C is a cross-sectional view illustrating a weak-write-voltage applying method of the semiconductor memory device according to the second embodiment.

In the erase operation, after the first voltage is applied to a gate dielectric film in a memory cell per bit at the time of erasing, the second voltage can be collectively applied to gate dielectric films in memory cells per block B1 to Bn at the time of weak writing.

Specifically, in FIG. 7A, at the time of erasing, the erase voltage Ve (for example, 6 V) is applied to the selected word line and 0 V is applied to the selected bit line. A voltage (for example, 0.8 V) sufficient to turn on the nonselected cells in the NAND string that includes the selected cell is applied to the nonselected word lines and the erase inhibit voltage Vfe (for example, 0.5 V) is applied to the nonselected bit lines. Moreover, a voltage that turns the select transistors MS1 on is applied to the select gate line SGD and a voltage that turns the select transistors MS2 off is applied to the select gate line SGS.

Then, the voltage of 0 V applied to the selected bit line is transferred to the selected cell via the select transistor MS1 and the nonselected cells, and the well 31, the source layer 33, and the drain layer 32 are set to 0 V. At this time, the erase voltage Ve is applied to the selected word line; therefore a high voltage is applied to the ferroelectric film 34 such that the channel side becomes negative and the control gate electrode 35 side becomes positive. Therefore, as illustrated in FIG. 7B, polarization 39 occurs in the ferroelectric film 34 such that the channel side becomes positive and the control gate electrode 35 side becomes negative, and the threshold of the cell transistor decreases. At this time, negative trapped charge 38 is trapped in the ferroelectric film 34 so as to cancel the decrease in the threshold of the cell transistor.

On the other hand, in the NAND cells connected to the nonselected bit lines, the erase inhibit voltage Vfe is applied to the nonselected bit lines; therefore, the select transistors MS1 are turned off. As a result, the cell transistors MT1 to MTh of the NAND cells connected to the nonselected bit lines become a floating state and the potential of the channels of the nonselected cells connected to the selected word line increases following the erase voltage Ve applied to the selected word line (self-boosting). Therefore, the voltage applied to the ferroelectric film 34 decreases in the nonselected cells connected to the selected word line. Thus, the polarization 39 of the ferroelectric film 34 can be prevented from being changing.

Next, as illustrated in FIG. 7C, at the time of weak writing, the weak write voltage Vwe (for example, −0.5 V) is applied to the word lines WL1 to WLh of the blocks B1 to Bn and the well potential of the memory cell array 1 is set to 0 V. The source layer 33 and the drain layer 32 can be set to 0 V. At this time, an electric field is applied to the ferroelectric film 34 in the direction opposite to that applied at the time of erasing. Therefore, the trapped charge 38 trapped in the ferroelectric film 34 is extracted and the effect of suppressing the decrease in the threshold of the cell transistor due to the trapped charge 38 is eliminated.

The absolute value of the weak write voltage Vwe can be set to a value smaller than the polarization inversion threshold of the ferroelectric film 34. For example, when the polarization inversion threshold of the ferroelectric film 34 is 2.5 V, the absolute value of the weak write voltage Vwe can be set to a value smaller than 2.5 V. Consequently, the trapped charge 38 trapped in the ferroelectric film 34 can be extracted without destroying the erased state of the memory cell.

As described above, the difference between the erased state and the written state with regard to the threshold of a cell transistor can be expanded by performing the weak write operation after the erase operation; therefore, a read margin can be increased and stability of the threshold after polarization inversion of a cell transistor can be improved.

Figure 8:
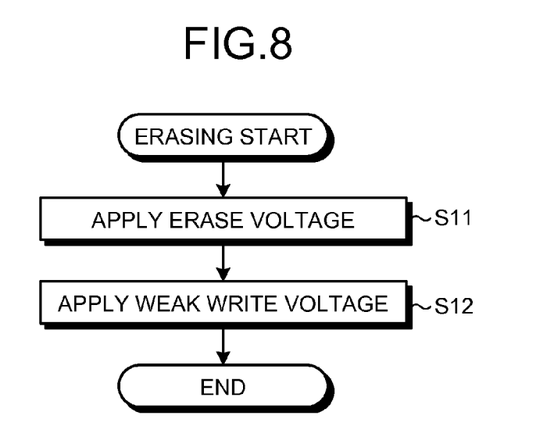
FIG. 8 is a flowchart illustrating an operation performed by the semiconductor memory device according to the second embodiment at the time of erasing.

FIG. 8 is a flowchart illustrating an operation performed by the semiconductor memory device according to the second embodiment at the time of erasing.

In FIG. 8, when the erase operation is started, the erase voltage Ve is applied to a memory cell such that polarization inversion of the ferroelectric film 34 occurs (S11).

Next, the weak write voltage Vwe is applied to the memory cell such that an electric field is applied to the ferroelectric film 34 in the direction opposite to that applied at the time of erasing and writing is not performed on the memory cell (S12).

Figure 9:
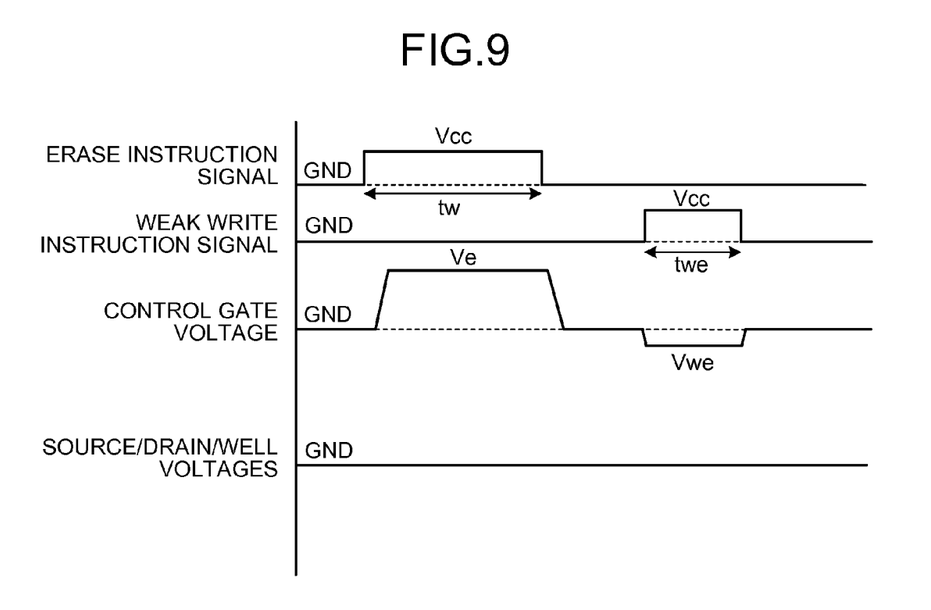
FIG. 9 is a timing chart illustrating an operation performed by the semiconductor memory device according to the second embodiment at the time of erasing.

FIG. 9 is a timing chart illustrating an operation performed by the semiconductor memory device according to the second embodiment at the time of erasing.

In FIG. 9, before erasing, the control gate voltage and the source/drain/well voltages are set to the ground potential GND. Then, when the erase instruction signal rises from the ground potential GND to the power supply potential Vcc, the control gate voltage rises from the ground potential GND to the erase voltage Ve. Therefore, the polarization 39 occurs in the ferroelectric film 34 such that the channel side becomes positive and the control gate electrode 35 side becomes negative. Thus, the threshold of the cell transistor decreases.

Next, when the erase instruction signal falls from the power supply potential Vcc to the ground potential GND, the control gate voltage falls from the erase voltage Ve to the ground potential GND. Then, when the weak write instruction signal rises from the ground potential GND to the power supply potential Vcc, the control gate voltage falls from the ground potential GND to the weak write voltage Vwe. Therefore, the trapped charge 38 trapped in the ferroelectric film 34 is extracted and the effect of suppressing the decrease in the threshold of the cell transistor due to the trapped charge 38 is eliminated. Then, when the weak write instruction signal falls from the power supply potential Vcc to the ground potential GND, the control gate voltage rises from the weak write voltage Vwe to the ground potential GND.

At this time, the erase voltage Ve and the weak write voltage Vwe can be set such that the absolute value of the electric field applied to the ferroelectric film 34 when the trapped charge 38 in the ferroelectric film 34 is extracted is smaller than the absolute value of the electric field applied to the ferroelectric film 34 when the polarization of the ferroelectric film 34 is inverted. The time twe during which the electric field due to the weak write voltage Vwe is applied to the ferroelectric film 34 can be set shorter than the time tw during which the electric field due to the erase voltage Ve is applied to the ferroelectric film 34. Moreover, the height or width of the voltage pulse of the weak write voltage Vwe may be variable. Moreover, the height or width of the voltage pulse of the weak write voltage Vwe can be specified from the outside.

In the above description, an explanation is given of a method in which, in the erase operation, after the first voltage is applied to a gate dielectric film in a memory cell per bit at the time of erasing, the second voltage is collectively applied to gate dielectric films in memory cells per block B1 to Bn at the time of weak erasing. As another method, it may be such that after the first voltage is collectively applied to gate dielectric films in memory cells per block B1 to Bn at the time of erasing, the second voltage is collectively applied to the gate dielectric films in the memory cells per block B1 to Bn at the time of weak erasing.

Moreover, the first embodiment describes the method of performing the weak erase operation after the write operation and the second embodiment describes the method of performing the weak write operation after the erase operation; however, both operations may be performed.

(Third Embodiment)

Figure 10:
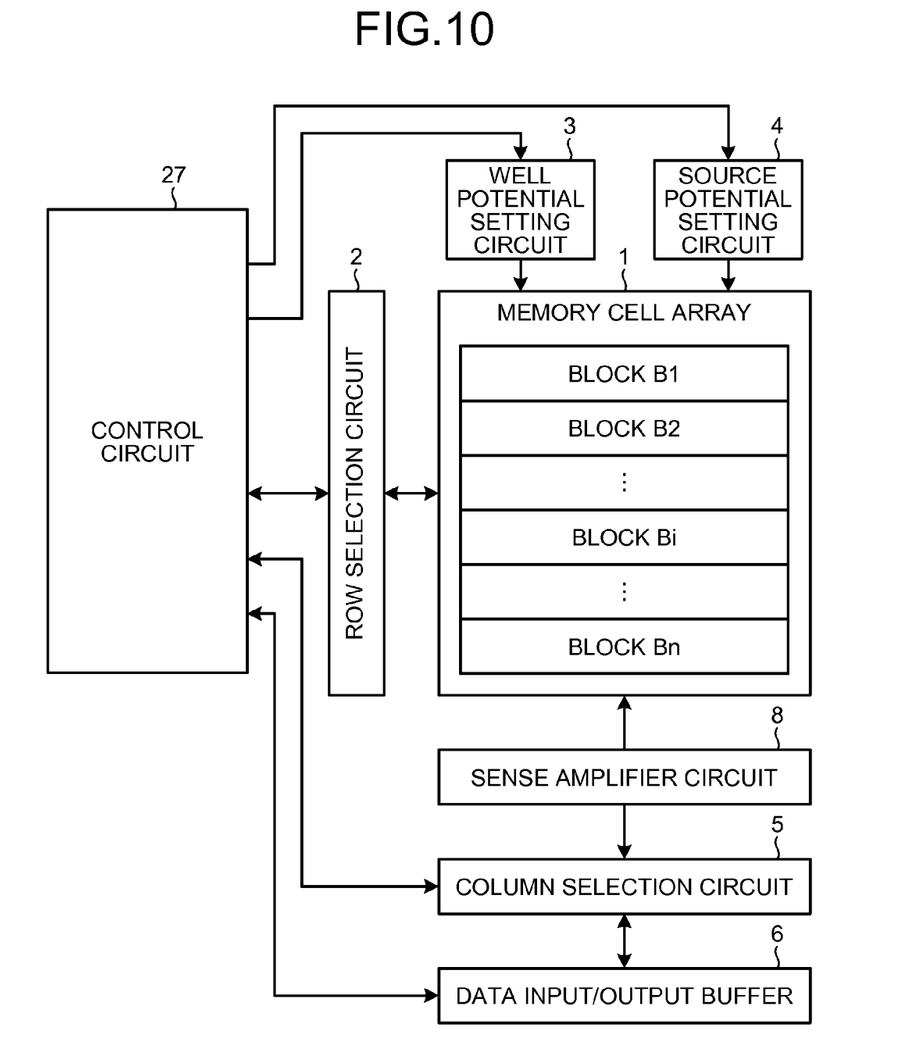
FIG. 10 is a block diagram illustrating the schematic configuration of a semiconductor memory device according to the third embodiment.

FIG. 10 is a block diagram illustrating the schematic configuration of a semiconductor memory device according to the third embodiment.

In FIG. 10, this semiconductor memory device includes a control circuit 27 instead of the control circuit 7 in the semiconductor memory device in FIG. 1. When data is stored in a memory cell, the control circuit 27 can apply the first voltage to the gate dielectric film thereof and thereafter apply the second voltage, whose amplitude is smaller than that of the first voltage and whose polarity is opposite to that of the first voltage, on the basis of the read result of the data from the memory cell. The second voltage can be applied per bit. At this time, when the data read from the memory cell is not correct, the second voltage can be applied to the memory cell and, when the data read from the memory cell is correct, the second voltage can be prevented from being applied. Moreover, at the time of writing to a memory cell, when the second voltage is applied per bit, the voltage applied to the control gate electrode 35 of a selected cell in a NAND string can be set larger than the voltage applied to the control gate electrodes 35 of nonselected cells in the NAND string.

Figure 11:
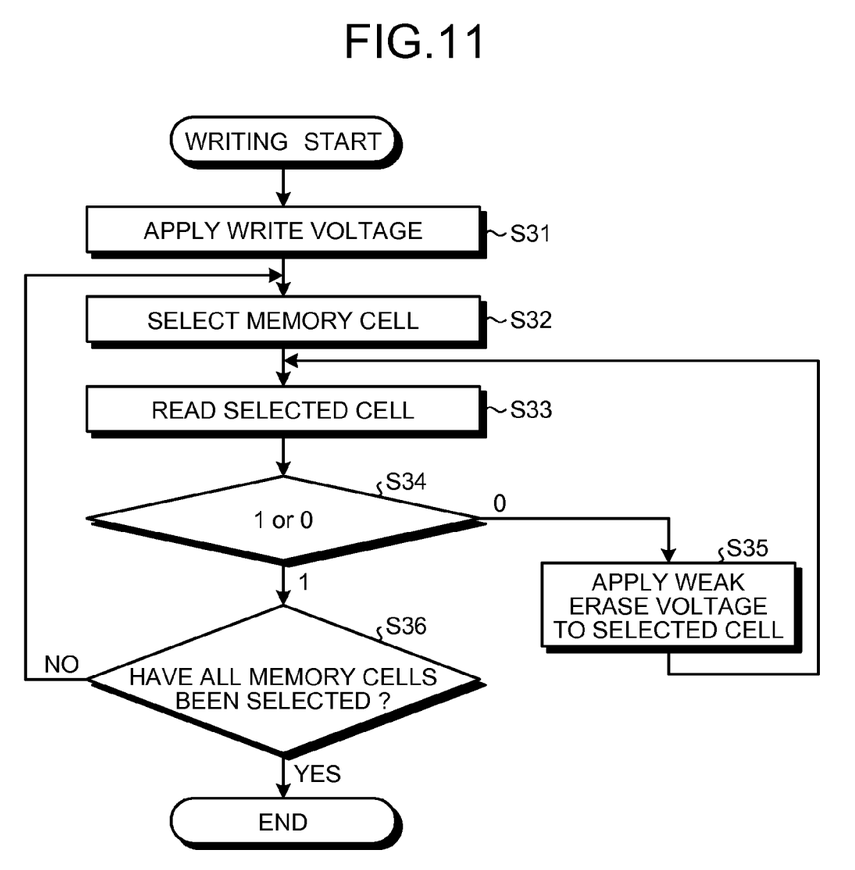
FIG. 11 is a flowchart illustrating an operation performed by the semiconductor memory device in FIG. 10 at the time of writing.

FIG. 11 is a flowchart illustrating an operation performed by the semiconductor memory device in FIG. 10 at the time of writing. In the following description, when '1' is stored in a memory cell, the memory cell is in a written state and when '0' is stored in a memory cell, the memory cell is in an erased state.

In FIG. 11, when the write operation is started, the write voltage Vpp is applied to the memory cells such that polarization inversion occurs in the ferroelectric films 34 (S31). Next, a memory cell to be a target for verification is selected (S32) and data is read from the selected cell (S33). A memory cell can be selected per bit.

Next, it is determined whether the data stored in the selected cell is '1' or '0' (S34). When the data stored in the selected cell is '0', the weak erase voltage Vwp is applied to the selected cell such that an electric field is applied to the ferroelectric film 34 in the direction opposite to that applied at the time of writing and the data written in the selected cell is not erased (S35).

On the other hand, when the data stored in the selected cell is '1', it is determined whether all the memory cells have been selected (S36). When not all the memory cells have been selected, the processes in S31 to S35 are repeated until all the memory cells are selected.

The weak erase voltage Vwp is applied to the selected cell only when the data stored in the selected cell is '0'; therefore, the thresholds of the memory cells can be prevented from becoming excessively high. Therefore, it can be prevented that data cannot be read from different memory cells in the same NAND string. Moreover, excessive weak erasing can be prevented from being performed from the beginning; therefore, polarization inversion can be prevented.

Figure 12:
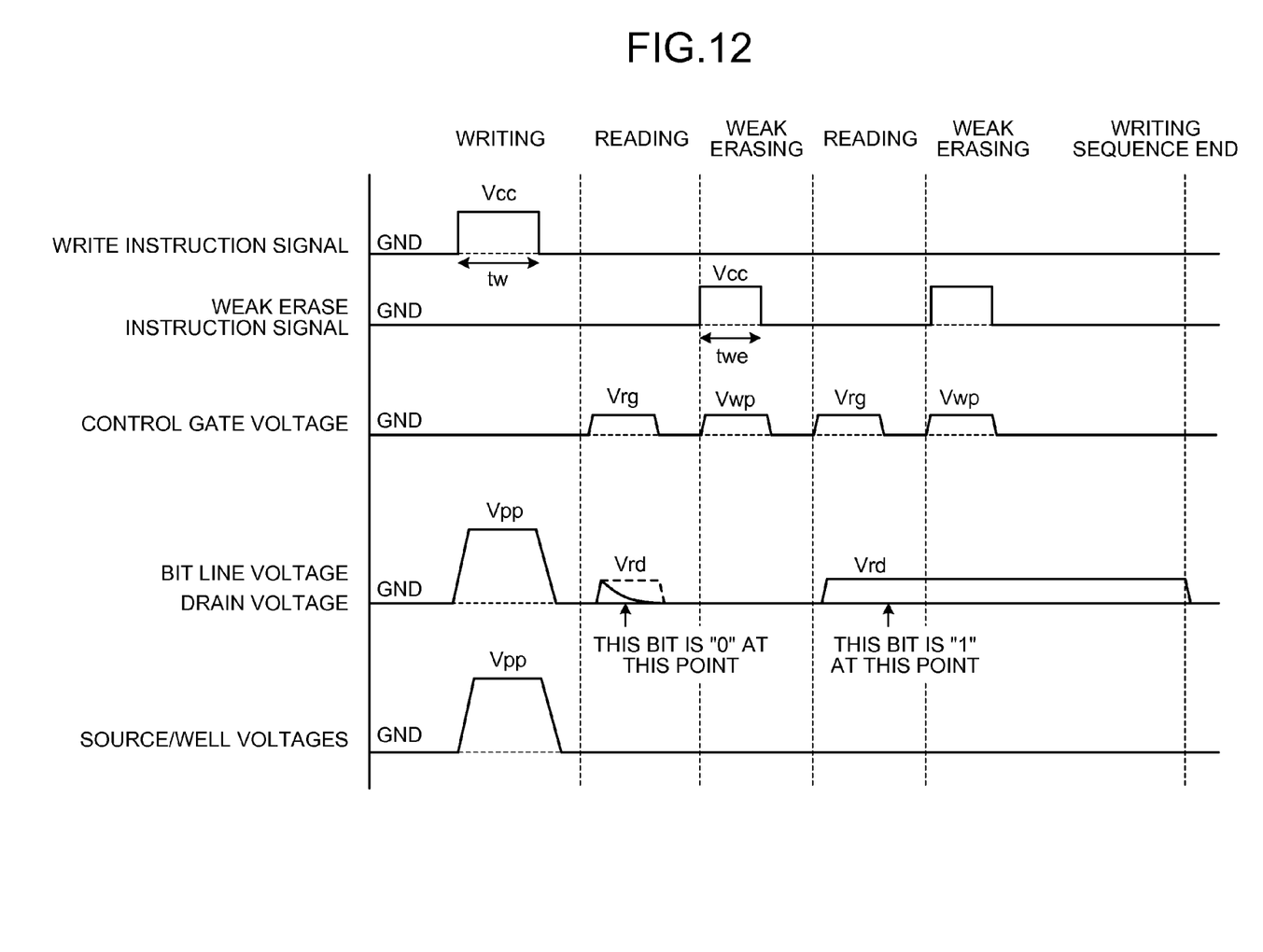
FIG. 12 is a timing chart illustrating an operation performed by the semiconductor memory device in FIG. 10 at the time of writing.

FIG. 12 is a timing chart illustrating an operation performed by the semiconductor memory device in FIG. 10 at the time of writing.

In FIG. 12, before writing, the control gate voltage, the bit line voltage, the drain voltage, and the source/well voltages are set to the ground potential GND. Then, when the write instruction signal rises from the ground potential GND to the power supply potential Vcc, the bit line voltage, the drain voltage, and the source/well voltages rise from the ground potential GND to the write voltage Vpp. Therefore, the polarization 37 occurs in the ferroelectric film 34 such that the channel side becomes negative and the control gate electrode 35 side becomes positive. Thus, the threshold of the cell transistor increases. Then, when the write instruction signal falls from the power supply potential Vcc to the ground potential GND, the bit line voltage, the drain voltage, and the source/well voltages fall from the write voltage Vpp to the ground potential GND.

Next, the read operation is performed after the write operation is performed. In this read operation, the control gate voltage of a selected cell rises from the ground potential GND to the read voltage Vrg by applying the read voltage Vrg to the selected word line. An intermediate voltage (for example, 2.5 V) sufficient to turn on the cell transistors is applied to the nonselected word lines. Moreover, an intermediate voltage sufficient to turn on the select transistors MS1 and MS2 is applied to the select gate lines SGD and SGS. Moreover, a precharge voltage is applied to the selected bit line and 0 V is applied to the source line SCE.

At this time, when the threshold of the selected cell has not reached a read level, the charge stored in the selected bit line is discharged via the NAND string; therefore, the potential of the selected bit line becomes a low level. On the other hand, when the threshold of the selected cell has reached a read level, the charge stored in the selected bit line is not discharged via the NAND string; therefore, the potential of the selected bit line becomes a high level.

Then, it is determined whether the threshold of the selected cell has not reached a read level by determining whether the potential of the selected bit line is a low level or a high level, whereby the data stored in the selected cell is read. For example, when the data stored in the selected cell is '0' even if the write operation is performed on the selected cell, the potential of the selected bit line becomes a low level. On the other hand, after the write operation is performed on the selected cell, when the data stored in the selected cell is '1', the potential of the selected bit line becomes a high level. When the weak erase operation is performed after the read operation is performed on the selected cell, the potential of the selected bit line after the read operation can be held until the weak erase operation.

Next, after the read voltage Vrg falls, the weak erase instruction signal rises from the ground potential GND to the power supply potential Vcc. Then, the control gate voltage rises from the ground potential GND to the weak erase voltage Vwp and weak erasing is performed per bit in accordance with the data read from the selected cell.

When this weak erasing is performed per bit, the voltage applied to the control gate electrode 35 of the selected cell in the NAND string can be set larger than the voltage applied to the control gate electrodes 35 of the nonselected cells in the NAND string. Moreover, the potential of the selected bit line after the read operation can be applied to the selected bit line. For example, when the data stored in the selected cell is '0', the weak erase voltage Vwp (for example, 1 V) is applied to the selected word line and 0 V is applied to the selected bit line. A voltage (for example, 0.8 V) sufficient to turn on the nonselected cells in the NAND string that includes the selected cell is applied to the nonselected word lines and the erase inhibit voltage Vfe (for example, 0.5 V) is applied to the nonselected bit lines. Moreover, a voltage that turns the select transistors MS1 on is applied to the select gate line SGD and a voltage that turns the select transistors MS2 off is applied to the select gate line SGS.

Then, the voltage of 0 V applied to the selected bit line is transferred to the selected cell via the select transistor MS1 and the nonselected cells, and the well 31, the source layer 33, and the drain layer 32 are set to 0 V. When the data stored in the selected cell is '0', the potential of the selected bit line is at a low level; therefore, the weak erase voltage Vwp is applied between the well 31 and the control gate electrode 35 of the selected cell. Therefore, the trapped charge 36 trapped in the ferroelectric film 34 is extracted and the effect of suppressing the increase in the threshold of the cell transistor due to the trapped charge 36 is eliminated. Then, when the weak erase instruction signal falls from the power supply potential Vcc to the ground potential GND, the control gate voltage falls from the weak erase voltage Vwp to the ground potential GND.

At this time, a voltage sufficient to turn on the nonselected cells in the NAND string is also applied to the ferroelectric films 34 in the nonselected cells; however, the voltage applied to the control gate electrodes 35 of the nonselected cells is smaller than the voltage applied to the control gate electrode 35 of the selected cell. Therefore, weak erasing can be prevented from being performed in the nonselected cells.

On the other hand, when the data stored in the selected cell is '1', the potential of the selected bit line is at a high level. Therefore, the weak erase voltage Vwp is not applied between the well 31 and the control gate electrode 35 of the selected cell. Thus, the threshold of the selected cell can be prevented from becoming excessively high.

On the other hand, in the NAND cells connected to the nonselected bit lines, the erase inhibit voltage Vfe is applied to the nonselected bit lines; therefore, the select transistors MS1 are turned off. As a result, the cell transistors MT1 to MTh of the NAND cells connected to the nonselected bit lines become a floating state and the potential of the channels of the nonselected cells connected to the selected word line increases following the weak erase voltage Vwp applied to the selected word line (self-boosting). Therefore, the voltage applied to the ferroelectric film 34 decreases in the nonselected cells connected to the selected word line. Thus, in the nonselected cells connected to the selected word line, the voltage applied to the ferroelectric film 34 decreases and weak erasing can be prevented from being performed.

Moreover, in the NAND memory, the weak erase operation can be performed on all the memory cells that share the same word line. At this time, the read operation and the weak erase operation can be performed until data '1' is read from all the bits in a page after writing or until the number of weak erase operations reaches the maximum number of repetitions.

In the above embodiment, an explanation is given where the voltage and duration of the weak erase operation are each the same over a plurality of weak erase operations; however, the voltage during the weak erase operation may be sequentially increased or the duration of the weak erase operation may be sequentially extended.

Consequently, it becomes possible to sequentially increase the degree of erasing starting from lower weak erasing. Therefore, it is possible to perform lower weak erasing on a memory cell for which the effect of weak erasing is large and perform higher weak erasing on a memory cell for which the effect of weak erasing is small.

When the voltage applied to the control gate electrode 35 of a selected cell in a NAND string is set equal to or lower than the voltage applied to the control gate electrodes 35 of nonselected cells in the NAND string, a voltage equal to or higher than the weak erase voltage Vwp is applied to the control gate electrodes 35 of the nonselected cells in the NAND string. Therefore, weak erasing is performed on the nonselected cells as well as the selected cell in the NAND string. Thus, weak erasing can be performed per NAND string.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
  a memory cell in which a ferroelectric film is provided as a gate dielectric film; and
  a control circuit that, when data is stored in the memory cell, applies a first voltage to the gate dielectric film and thereafter applies a second voltage, whose amplitude is smaller than that of the first voltage and whose polarity is opposite to that of the first voltage,
  wherein the memory cell includes:
    a source layer and a drain layer that are formed in a well, and
    a control gate electrode that is formed on the well between the source layer and the drain layer with the gate dielectric film between the control gate electrode and the well,
  wherein a NAND string is formed by connecting cell transistors each included in the memory cell in series, and
  wherein both ends of the NAND string are connected to a bit line and a source line via a select transistor, respectively.

2. The semiconductor memory device according to claim 1, wherein the control circuit performs a write operation on the memory cell by collectively applying the second voltage to the gate dielectric film per block after collectively applying the first voltage to the gate dielectric film per block.

3. The semiconductor memory device according to claim 1, wherein the control circuit performs a write operation on the memory cell by applying the second voltage to the gate dielectric film per bit or per NAND string after collectively applying the first voltage to the gate dielectric film per block.

4. The semiconductor memory device according to claim 3, wherein when the control circuit applies the second voltage to the gate dielectric film per bit, the control circuit sets a voltage applied to the control gate electrode of a selected cell in the NAND string to be larger than a voltage applied to the control gate electrode of a nonselected cell in the NAND string.

5. The semiconductor memory device according to claim 1, wherein the control circuit performs a write operation on the memory cell by applying 0 V to the control gate electrode and a write voltage to the well when the first voltage is applied and applying a weak erase voltage to the control gate electrode and 0 V to the well when the second voltage is applied.

6. The semiconductor memory device according to claim 1, wherein the control circuit performs an erase operation on the memory cell by collectively applying the second voltage to the gate dielectric film per block after applying the first voltage to the gate dielectric film per bit.

7. The semiconductor memory device according to claim 1, wherein the control circuit performs an erase operation on the memory cell by collectively applying the second voltage to the gate dielectric film per block after collectively applying the first voltage to the gate dielectric film per block.

8. The semiconductor memory device according to claim 1, wherein the control circuit performs an erase operation on the memory cell by applying an erase voltage to the control gate electrode and 0 V to the bit line when the first voltage is applied and applying a weak write voltage to the control gate electrode and 0 V to the well when the second voltage is applied.

9. The semiconductor memory device according to claim 1, wherein an amplitude of the first voltage is equal to or larger than a polarization inversion threshold of the ferroelectric film and an amplitude of the second voltage is smaller than the polarization inversion threshold of the ferroelectric film.

10. The semiconductor memory device according to claim 1, wherein an application time of the second voltage is shorter than an application time of the first voltage.

11. The semiconductor memory device according to claim 1, wherein at least one of an amplitude and an application time of the second voltage is variable.

12. A semiconductor memory device comprising:
  a memory cell in which a ferroelectric film is provided as a gate dielectric film; and
  a control circuit that, when data is stored in the memory cell, applies a first voltage to the gate dielectric film and thereafter applies a second voltage, whose amplitude is smaller than that of the first voltage and whose polarity is opposite to that of the first voltage, on a basis of a read result of data from the memory cell,
  wherein the memory cell includes
    a source layer and a drain layer that are formed in a well, and
    a control gate electrode that is formed on the well between the source layer and the drain layer with the gate dielectric film between the control gate electrode and the well, wherein a NAND string is formed by connecting cell transistors each included in the memory cell in series, and wherein both ends of the NAND string are connected to a bit line and a source line via a select transistor, respectively.

13. The semiconductor memory device according to claim 12, wherein the control circuit performs a write operation on the memory cell by applying the second voltage to the gate dielectric film per bit on a basis of a read result of data from the memory cell after collectively applying the first voltage to the gate dielectric film per block.

14. The semiconductor memory device according to claim 13, wherein when the control circuit applies the second voltage to the gate dielectric film per bit, the control circuit sets a voltage applied to the control gate electrode of a selected cell in the NAND string to be larger than a voltage applied to the control gate electrode of a nonselected cell in the NAND string.

15. The semiconductor memory device according to claim 13, wherein the control circuit performs a write operation on the memory cell by applying 0 V to the control gate electrode and a write voltage to the well when the first voltage is applied and applying a weak erase voltage to the control gate electrode and a voltage in accordance with a read result from the memory cell to the bit line when the second voltage is applied.

16. The semiconductor memory device according to claim 12, wherein an amplitude of the first voltage is equal to or larger than a polarization inversion threshold of the ferroelectric film and an amplitude of the second voltage is smaller than the polarization inversion threshold of the ferroelectric film.

17. The semiconductor memory device according to claim 12, wherein an application time of the second voltage is shorter than an application time of the first voltage.

18. The semiconductor memory device according to claim 12, wherein at least one of an amplitude and an application time of the second voltage is variable.

* * * * *